United States Patent
Harf

[15] 3,693,102

[45] Sept. 19, 1972

[54] DIGITAL OSCILLATOR HAVING A FAST RESPONSE USING TWO ONE-SHOT MULTIVIBRATORS AND A PAIR OF NAND GATES

[72] Inventor: Kenneth G. Harf, Binghamton, N.Y.

[73] Assignee: Singer-General Precision, Inc., Binghamton, N.Y.

[22] Filed: May 27, 1971

[21] Appl. No.: 147,425

[52] U.S. Cl...............328/188, 178/DIG. 4, 307/215, 307/218, 307/265, 307/273, 328/61, 328/92, 328/207, 331/135

[51] Int. Cl................................................H03k 3/02

[58] Field of Search......307/215, 218, 273, 269, 265; 328/59–61, 92, 207, 187–189; 331/57, 107, 111, 135, 143; 178/DIG. 4

[56] References Cited

UNITED STATES PATENTS

| | | | |
|---|---|---|---|
| 3,350,659 | 10/1967 | Henn | 331/57 |
| 3,395,362 | 7/1968 | Sutherland | 331/57 |
| 3,517,326 | 6/1970 | Roesch | 331/57 |
| 3,543,184 | 11/1970 | Lane | 331/111 |
| 3,562,558 | 2/1971 | Totten | 307/269 |

OTHER PUBLICATIONS

Pub. I " Reliable One-Shot Has High Repetition Rate" in Electronic Design 25, Dec. 6, 1967, pages 120 & 122.

*Primary Examiner*—Stanley D. Miller, Jr.
*Attorney*—Francis L. Masselle, William Grobman and John C. Altmiller

[57] ABSTRACT

A digital oscillator which provides fast response and permits variable frequencies and pulse widths is shown. By combining two gates and two one-shot multivibrators a circuit is provided which will begin to have outputs as soon as the input gate is enabled. Pulse width and repetition rate is adjusted by varying the time constants of the one shots. In addition a crosshatch of dot generator useful in television display adjustment which uses two of the oscillators to obtain its output is shown.

9 Claims, 3 Drawing Figures

INVENTOR.
Kenneth G. Harf
BY
John C. Altmiller
AGENT

INVENTOR.
Kenneth G. Harb
BY
John C. Altmiller
AGENT

DIGITAL OSCILLATOR HAVING A FAST RESPONSE USING TWO ONE-SHOT MULTIVIBRATORS AND A PAIR OF NAND GATES

This invention relates to test equipment in general and more particularly to a crosshatch generator useful in television test and adjustment.

In order to get a display on a television screen which has the proper proportions i.e. height, width, linearity, etc., various types of signal generators such as dot generators and crosshatch generators are used. In general, the signal generator will output signals to provide lines or dots at equal time increments. The display is then adjusted so that the lines or dots appear at equal linear increments on the display screen.

Such signal generators are particularly necessary for use in conjunction with the method of generating a spherical raster described in U.S. application Ser. No. 130,217 filed by R. F. H. McCoy et al. on Apr. 1, 1971. In that type of display equal angles must be scanned in equal time. Thus a crosshatch generator, generating signals at equal time increments, may be used to adjust the display so that the lines appear at equal angular increments.

In the past the type of oscillator used in such generators has required time to start up and thus the positioning of the first line could not be too close to the edge of the display. The present invention provides a crosshatch generator using a digital oscillator which has nanosecond response and avoids this problem.

It is the primary object of this invention to provide a digital oscillator.

Another object is to provide such an oscillator using two gates and two one-shot multivibrators.

A further object is to provide a crosshatch generator which has fast response.

Other objects of the invention will in part be obvious and will in part appear hereinafter.

The invention accordingly comprises the features or construction, combination of elements, and arrangement of parts, which will be exemplified in the construction hereinafter set forth, and the scope of the invention will be indicated in the claims.

For a fuller understanding of the nature and objects of the invention reference should be had to the following detailed description taken in connection with the accompanying drawings, in which.

Figure 1:
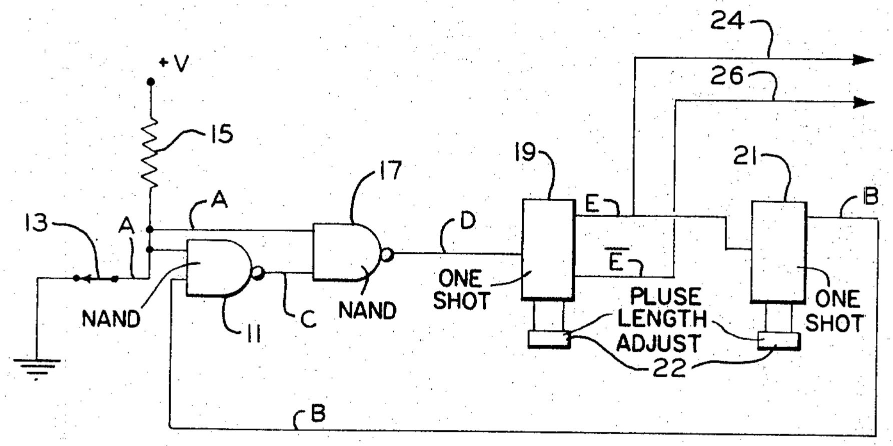
FIG. 1 is a circuit diagram of a preferred embodiment of the digital oscillator.

FIG. 1 shows the digital oscillator. Gate 11 has a first input connected to ground through switch 13. This input is also connected through resistor 15 to a positive voltage. A gate 17 has as one input the output of gate 11 and a second input is connected to the first input of gate 11.

The output of gate 17 is an input to one-shot multivibrator 19. One output of one-shot 19 is an input to a second one-shot multivibrator 21 and may also be used as a circuit output on line 24. An inverted output from one-shot 19 is provided on line 26. The output of one-shot 21 is provided as a second input to gate 11.

Figure 2:
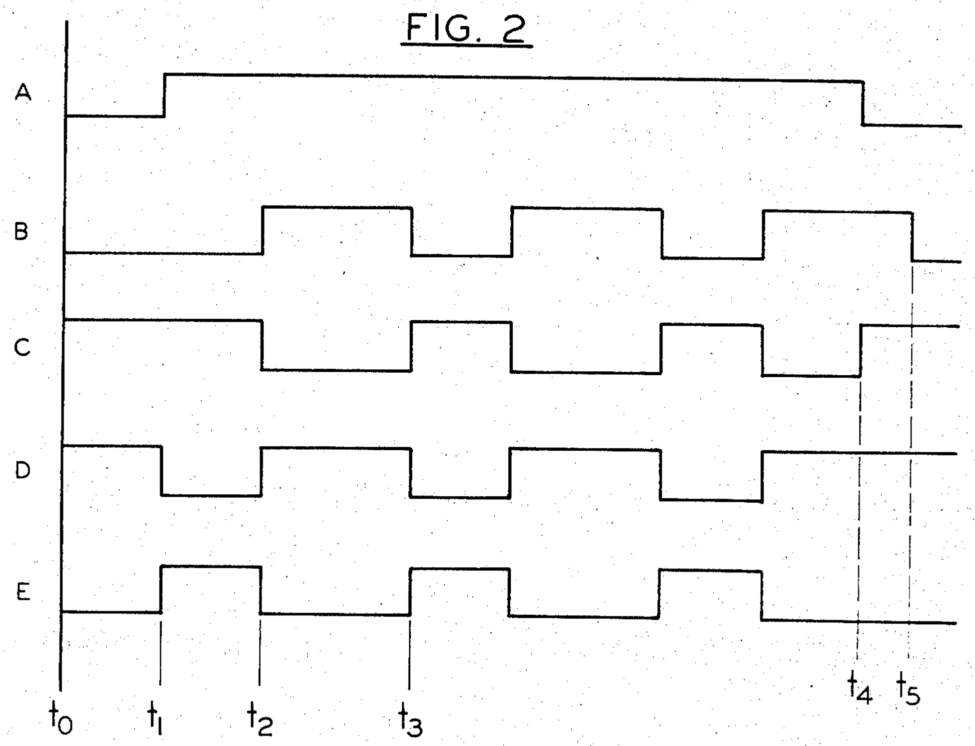
FIG. 2 is a timing diagram.

To facilitate understanding of circuit operation each input and output has been assigned a letter for use in logic equations and the timing diagram of FIG. 2. Gates 11 and 17 are Nand gates. That is, the truth tables for these gates are as follows:

| Gate 11 | | | Gate 17 | | |
|---|---|---|---|---|---|
| A | B | C | A | C | D |
| 1 | 1 | 0 | 1 | 1 | 0 |
| 0 | 1 | 1 | 0 | 1 | 1 |
| 1 | 0 | 1 | 1 | 0 | 1 |
| 0 | 0 | 1 | 0 | 0 | 1 |

where "0" indicates a ground and "1" indicates a positive voltage.

One-shot 19 and 21 are set to trigger on a negative-going pulse. When the circuit is as shown, A will be "0" and B will be "0"; thus, C will be a "1", and likewise D will be a "1". E will be a "0". This is the condition shown between times $t_0$ and $t_1$ on FIG. 2. If at time $t_1$ switch 13 is opened, A will go to "1". B remains "0" so C remains "1".

With both A and C at "1", D will go to "0". This negative-going edge will trigger one-shot 19 and E will go to "1". E will stay at "1" for a time determined by the setting of the one-shot. Generally, this is done by adjusting the time constant of a resistor and capacitor. Such methods are well known and details are available from manufacturers of one-shots such as Texas Instruments or Motorola.

When one-shot 19 goes off, E goes to "0" and its negative edge will trigger one-shot 21, causing B to go to "1". With B at "1" C will now go to "0" and D to "1". One-shot 21 will stay on until $t_3$, the time between $t_2$ and $t_3$ again determined by an RC time constant. When one-shot 21 goes off at $t_3$, B goes to "0", C goes to "1" and D goes to "0" triggering one-shot 19 to start the cycle all over.

This cycle will continue as long as A remains at "1". If at time $t_4$ switch 13 is closed, A will go to "0". B is at "1" and will remain there until reaching $t_5$ (determined by one-shot 21's RC time constant). C will go to "1", D will remain at "1" and E will remain at "0". Thus, when B goes to "0" at time $t_5$ the circuit will be back in its initial state and may be started again at any time.

By adjusting the two RC time constants, pulse width (adjustment of one-shot 19) and pulse repetition rate (one-shot 21) may be controlled. The resistance and capacitance is normally external to the circuit and is indicated by blocks 22. In each of these the resistance will be variable thus allowing easy adjustment.

Figure 3:
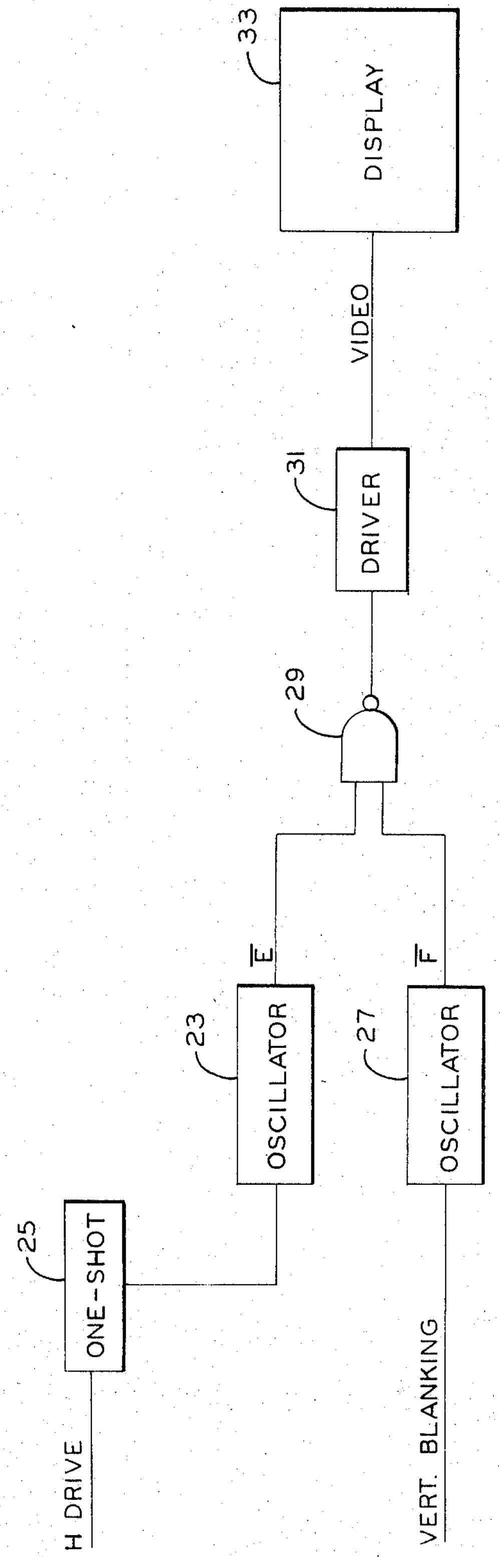
FIG. 3 is a preferred embodiment of a crosshatch generator using the oscillator of FIG. 1.

FIG. 3 shows a preferred embodiment of a crosshatch generator using the oscillator of FIG. 1. A first oscillator 23 is connected to a one-shot 25 in place of the ground connection shown on FIG. 1. One-shot 25 is triggered by the start of the horizontal drive pulse and will be adjusted to be on for a time equal to one horizontal scan line (or more or less if desired). Thus, when it is triggered its output will go from "0" to "1" starting oscillator 23. The $\overline{E}$ output from the oscillator was at "1" as would be the $\overline{F}$ output from a second oscillator 27. Thus the Nand gate 29 into which these two oscillators provide inputs would be at "0". As soon as $\overline{E}$ goes to "0" however, the output of gate 29 will go to "1". This pulse is then amplified by a cable driver 31 and provided as a video input to a display 33. The length of time this pulse is present on the display, and thus its width, is adjusted by adjusting the one-shot 19 of FIG. 1 in oscillator 23. The number of such lines which appear will be determined by the setting of one-shot 21.

The result of using oscillator 23 alone in this configuration would be a series of vertical lines on the face of the display.

Oscillator 27 provides the horizontal lines of the crosshatch. Replacing the ground of FIG. 1 at the oscillator input is the vertical blanking signal. It will be a "0" during blanking and an "1" at other times. Thus, as the vertical scan starts a "1" will be present at the input (A on FIG. 1) and the oscillator 27 will start. Similarly, line width and spacing is adjusted by means of one-shots 19 and 21 of FIG. 1. However, since the vertical scan is much slower, the times involved will be longer. The $\overline{F}$ output of oscillator 27 is the second input to gate 29. Thus, whenever either $\overline{E}$ or $\overline{F}$ or both go to a zero an output from gate 29 resulting in video to display 33 will occur. The final result is a crosshatch pattern on the face of display 33. The switch 13 shown on FIG. 1 although not needed for operation is still useful to allow the oscillators to free run for purposes of adjusting line width and spacing.

If instead of using $\overline{E}$ and $\overline{F}$, E and F are used and Nand gate 29 is replaced by an And gate (or any logically equivalent arrangement) output will occur only when both pulses are present or, in other words, only where the lines cross, resulting in a dot generator.

Because of the fast response of the oscillators to the horizontal drive or vertical blanking signal it is possible to have lines or dots very close to the edges of the display raster, thus making adjustments of the raster more accurate. Thus a digital oscillator with a fast response and its application to a crosshatch or dot generator has been shown. Although it has been shown using certain types of logic blocks it should be evident to those skilled in the art that other combinations of different logic blocks which are logically equivalent will work equally well.

What is claimed is:

1. A digital oscillator responsive to a two-level logic signal in which with a positive signal input the oscillator will be on and with a ground signal input the oscillator will be off, comprising:

a. a first Nand gate having the logic signal as one input;

b. a second Nand gate having the logic signal as one input and the output of said first gate as a second input;

c. a first one-shot multivibrator, set to trigger on a negative-going pulse, having the output of said second gate connected to its triggering input and having its output as the oscillator output; and d. a second one-shot multivibrator, set to trigger on a negative-going pulse, having the output of said first one shot as its triggering input and having its output connected to the other input of said first gate.

2. The invention according to claim 1 wherein said logic signal is provided from the junction of a first switching means and a resistor, said switching means capable of providing a ground, and the other side of said resistor is connected to a positive voltage.

3. The invention according to claim 2 wherein said switching means is a single pole, single throw switch connected to ground.

4. The invention according to claim 2 and further including a second switching means, third and fourth gates, and third and fourth one-shots connected together in like manner to said first and second gate and said first and second one-shots, and a fifth gate having the outputs of said first and said third one-shots as its inputs.

5. The invention according to claim 4 wherein said fifth gate is an OR gate.

6. The invention according to claim 4 wherein said fifth gate is an AND gate.

7. The invention according to claim 4 wherein said oscillators provide inputs to a television display to provide a test signal for adjustment and said first switching means is adapted to provide a ground during horizontal retrace and a positive voltage during the active portion of the horizontal scan on the display, and said second second switching means is adapted to provide a ground during vertical retrace and a positive voltage during the active portion of the vertical scan.

8. The invention according to claim 7 wherein said first switching means is a fifth one-shot having the horizontal drive signal of the display as its input and adjusted to provide a positive output pulse starting with each drive pulse and lasting for a time up to the time of one horizontal scan, and said second switching means is provided by the vertical blanking signal of said display.

9. The invention according to claim 8 wherein the pulse times of said first, second, third, fourth and fifth one-shots are adjustable.

* * * * *